March 15, 1966 J. C. GAUDIO 3,240,642

METHOD OF PRINTING AN ELECTRICAL COMPONENT

Filed Jan. 18, 1960 2 Sheets-Sheet 1

INVENTOR.
James C. Gaudio
BY
Francis W. Crotty
Atty.

INVENTOR.
James C. Gaudio
BY
Francis W. Crotty
Atty.

United States Patent Office 3,240,642
Patented Mar. 15, 1966

3,240,642

METHOD OF PRINTING AN ELECTRICAL COMPONENT

James C. Gaudio, Chicago, Ill., assignor to Zenith Radio Corporation, a corporation of Delaware Filed Jan. 18, 1960, Ser. No. 3,148
12 Claims. (Cl. 156—89)

The present invention pertains in general to the printing of electrical circuit components and is more particularly concerned with the imprinting of such components upon a core which may be circular in cross section. The invention is especially advantageous for use in the construction of turret-type tuning devices employed in multi-band receivers, such as television receivers and, in presenting a specific description thereof, it is convenient to consider its application to such a tuner.

A turret-type of tuner in its usual form may be likened to a barrel in construction wherein components which may be thought of as the staves of the barrel are tuning strips each of which is constructed and adjusted to correspond to one television channel. Each of these tuning strips is equipped with a family of contacts which may selectively be brought into engagement with a like group of contacts fixed to a stationary member. The presentation of any such strip to the stationary contacts is made possible by mounting the family of strips for rotation. When the contacts of any strip are brought into engagement with the stationary contacts, the receiver including the tuner is tuned to accept the channel for which that particular strip is adjusted.

Such an arrangement has very beneficial properties since a television instrument is most often tuned by inexpert hands. Where the circuit parameters on the tuning strips satisfy precise values, tuning to consecutive channels is not only convenient but is very sharp and fine tuning adjustments, generally required when the receiver is tuned from one channel to the next, may be entirely eliminated.

As previously constructed, the tuning strips carry inductors, capacitors and resistors of rather conventional construction secured by soldering or some similar operative step to the strip. While this has permitted a satisfactory construction of the turret, it is highly desirable that different techniques of construction be found to permit miniaturization of the turret especially where it is to be employed as the tuning device of a portable television receiver. One might expect that the desired result could be attained by the usual techniques of painting or printing the circuit components to a supporting member serving as the tuning strip structure. While it might be expected that circuit components could be printed on such a support by known transfer techniques such as decalcomanias, previous efforts to adapt these familiar techniques to the construction of tuning strips have failed. The failure has been attributed either to such high processing costs as to render the printing an impractical solution to the problem or, as in the case of decalcomanias, to the fact that burning off or otherwise removing the organic material, such as the transfer sheet carrying the decalcomania, incident to the printing has distorted the pattern of the circuit components and destroyed its necessary electrical properties.

Accordingly, it is an object of the present invention to provide a method of printing electrical circuit components upon a core or supporting member which avoids the aforementioned difficulties of prior printing processes.

It is a particular object of the invention to provide a new method for printing electrical circuit components upon a core.

It is another particular object of the invention to provide a process for printing the electrical circuit components upon a core member which process is acceptable from the standpoints of cost and perfection of the printed circuit component.

It is a specific object of the invention to provide a new and improved method of printing electrical circuit components upon the core or supporting member of a tuning strip for use in a turret-type tuner.

The inventive method is particularly applicable to the printing of an electrical component of certain desired electrical properties upon a core member which, in cross section, has at least a portion that is a continuous curve. The method comprises the printing of an at least substantially solidified developed pattern of the circuit component upon a first surface with a composition of material including an ingredient which exhibits the electrical properties desired of and corresponding to that circuit component. A coating of adhesive material, which has greater adhesion for the printing composition than does the aforesaid first surface, is applied to at least one of the surfaces represented by the developed pattern and by the external periphery of the curved portion of the core member. The curved portion of the core member is thereafter placed in contact with the aforementioned first surface in alignment with the pattern that has previously been developed thereon. Finally, relative movement is effected of the core member and the aforesaid first surface while exerting pressure thereon to establish and maintain intimate contact therebetween to cause the core member to roll over the developed pattern and transfer the pattern thereto. Invention also resides in the employment of this general approach to the formation of a plural-turn coil on a cylindrical core and wherein the trailing ends of the developed coil turns are shaped to overlie and extend beyond the sides of the respective leading ends so as to overlap the latter when the pattern is transferred and affixed to the core.

In one specific embodiment of the invention, the tuning strip has a ceramic core which is an elongated cylinder, that is to say, a cylinder having an axial length which is large relative to its diameter. The component printed on the cylinder may, for example, be a multi-turn inductor and the developed pattern of the inductor is arranged so that the developed length of each inductor turn exceeds the circumferential dimension of the core. Consequently, when the pattern is applied to the core by rolling the cylinder thereover the leading and trailing edges of the inductor turns overlap. This provides circuit continuity from turn to turn. In this use of the invention, the developed pattern is printed with a composition including both a glass frit and a conductive element such as silver so that firing of the strip, after the pattern has been transferred thereto, integrates the pattern with the strip and reduces oxidation of the silver, if there be any, simultaneously to improve the conductive properties of the coil.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figure 1:
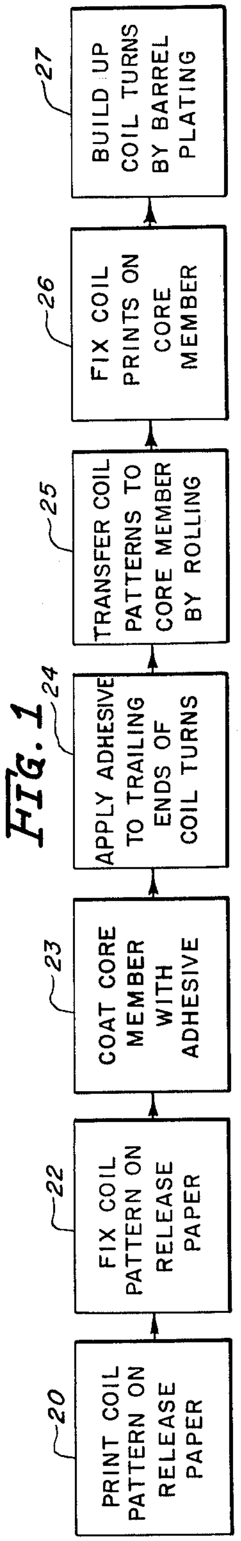
FIGURE 1 is a flow chart of the several steps of one embodiment of the invention.
Figure 3:
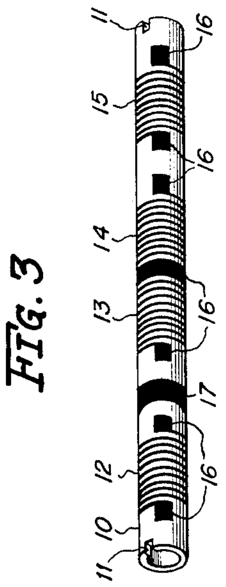
FIGURE 3 represents a cylindrical tuning strip after the pattern of FIGURE 2 has been transferred thereto.

Before examining in detail the several manipulative steps of the inventive process represented by the flow chart of FIGURE 1, it is convenient to consider the finished tuning strip represented in FIGURE 3. This structure comprises a core member 10 which, if it is to derive maximum benefit from the process of the invention, has a cross section that is at least in part a continuous curve. As shown, the core is a true hollow cylinder formed of a ceramic or glass and having notches 11, 11 provided at its opposed ends. The notches function in conjunction with keys or locating projections carried by the end plates of a turret tuner not only to support the strip in position within the tuner but also to orient it angularly with respect to its longitudinal axis so that contact areas of the strip, presently to be described, are properly positioned to engage companion stationary contacts when the turrent is manipulated to bring this particular strip into operative position within the television receiver which it tunes. There are printed on this strip a series of electrical components having desired predetermined electrical properties. More particularly, there are a series of multi-turn inductance coils 12–15 printed on the strip and the end turns of each coil terminate in contact patches 16, 16. A continuous conductive band 17 is printed on the strip intermediate coils 12 and 13. This band, in conjunction with structural shielding members incorporated in the housing of the turret structure, is provided for the purpose of effecting isolation between coils 12, 13.

The details of the composite tuning mechanism have not been shown because the invention concerns itself with the process of printing on the tuning strip as distinguished from other structural features of the turret tuner and also because the tuner, except for the method of forming circuit components on the strip, may be conventional in its design and construction. Suffice it to say that the turret structure has at least a pair of end plates or discs with mounting provisions which enter the opposed ends of hollow core 10 mechanically to secure the strip within the turret structure and, by means of orienting notches 11, present contact patches 16 in the proper aspect to be engaged by the stationary contacts of the tuner as the end plates are rotated to carry the strip into operative position within the receiver.

Figure 2:
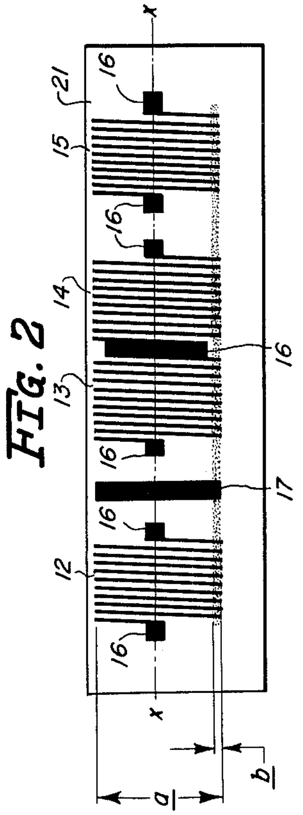
FIGURE 2 represents a developed pattern of several circuit components to be printed on the tuning strip.

The process of forming coils 12–15 on core 10 includes as a first step the printing of a developed pattern of the desired circuit components upon a first surface with a coating composition having such ingredients that the printed components exhibit the desired electrical properties. This step is indicated in box 20 of the flow chart and will be considered in greater detail in connection with FIGURE 2 which represents one form of a developed pattern for the several circuit components carried on core 10 of the tuning strip of FIGURE 3. The developed patterns of the several circuit components may be printed initially on any of a variety of surfaces including glass, ceramic, transfer paper or the like but it will be assumed that this surface, which is designated 21 in FIGURE 2, is a conventional parchment release paper having a silicone treatment on the side or face upon which the component patterns are to be printed. The silicone treatment is found to be a most beneficial step for preparing the surface to accept the pattern reliably where the pattern is to be applied through a conventional silk screening process. Suitable commercially available release papers are those designated Riegelease GC No. 40/41 made by Riegel Paper Corporation and silicone release paper 6–P–40 made by Redson-Rice Corporation.

In carrying out the silk screening process, a stencil is prepared in known manner to correspond to the developed patterns of coils 12–15, contact patches or areas 16 and grounding strip 17. These patterns are then established on transfer paper 21 by means of a metallic paste applied over the stencil. The composition of the paste is selected with the view of imposing the desired electrical properties on the finished circuit components and also with the view of facilitating a firm bond or integration of such circuit components with core 10 of the tuning strip.

Where the component is to be predominantly conductive, the paste includes a conductive member as one ingredient and for this purpose silver flakes may conveniently be employed. Where the core is formed of glass or ceramic, it is also desirable that the printing composition have as another ingredient a glass frit which, when subjected to heat, may fuse to the core member. In selecting the frit, consideration must be given to its melting point which should be low relative to that of the material of core 10 as well as its physical coefficient of expansion, contraction, etc. Preferably, these coefficients of the frit should match as closely as practicable the corresponding coefficients of core 10. These ingredients are held in composition by a suitable plastic binder which may be ethyl cellulose in conjunction with a solvent for that binder such as butal carbitol acetate, the solvent serving to disperse the binder through the paste. A commercially available metallic paste that has been satisfactorily employed in this construction is Dupont Silver Compound, No. 7622.

In preparing the stencil to print circuit components having a series of conductor turns, it is desirable that the length *a* of the pattern corresponding to each conductor turn exceed the circumferential dimension of core 10 so that when the pattern is transferred to core 10, in a manner to be considered hereinafter, there will be a sufficient overlap of the leading end of one coil turn and the trailing end of the next succeeding coil turn. The overlap, represented by dimension line *b* in FIGURE 2, is preferably of the order of ten-thousandths of an inch. The terms leading and trailing ends are here used in the sense that the portion of a coil turn which is first contacted by the core in transferring the pattern thereto is the leading end and the portion which is last transferred to the core is the trailing end. It will be apparent from inspection of FIGURE 2 that the portions of the patterns corresponding to the coil turns are canted or pitched as required to provide an overlap of the leading and trailing ends of consecutive coil turns as mentioned above.

Box 22 of the flow chart denotes the next step to be the fixing of the coil or circuit-component patterns on the sheet of release paper 21. This may be accomplished by subjecting printed surface 21 to heat which drives out the solvent of the printing mixture and causes the printed patterns to solidify. In practicing the invention with the use of a batch oven, the printed transfer sheet was heated to a temperature of 150° F. for approximately one and one-half hours but it will be recognized that the use of a continuous oven or other heat treating devices may reduce this time requirement substantially.

The next step, outlined in box 23 of the flow chart, is the application of an adhesive material required to transfer the patterns from transfer sheet 21 to core 10 as the core is rolled over the printed patterns. This may be achieved by including an adhesive in the printing composition so that the patterns as established on transfer sheet 21 present the necessary adhesive for attaching to the core or a coating of adhesive may be applied to either or both of the surfaces represented by the printed patterns on transfer sheet 21 and by the external periphery or circumference of core 10 of the tuning strip. Entirely satisfactory results have been achieved by applying a coating of adhesive material to the external periphery of core 10. This adhesive must have a greater adhesion for the printed patterns than does the silicone treated surface of transfer sheet 21. In general, the adhesive to be employed for transferring the printed patterns from the transfer sheet to the cylindrical core is what is referred to in the art as a pressure sensitive or tacky adhesive by which is meant a material which affixes itself in response to an applied pressure. A suitable adhesive is DC6038 marketed by Daubert Chemical Company.

If the adhesive is applied to the surface of core 10 as stated, it is then desirable to apply that same adhesive to the trailing ends of the coil turns, as indicated in box 24 of the flow chart, to assure complete and effective closing of the turns as the patterns are transferred to the core. This entails applying a strip of the adhesive in the area set off by dimension line *b* in FIGURE 2. The core and developed patterns of the several electrical components have now been prepared for the transfer of the patterns to the core which is the process step designated in box 25 of the flow chart. This may be accomplished most expeditiously by a transfer mechanism such as that represented in FIGURE 4.

It comprises a stationary base 30 supporting a carriage 32 which may slide upon rails resulting from forming the mating surfaces of stationary base member 30 and slide 32 in the manner similar to that of a well-recognized dovetail joint but leaving sufficient clearance to permit free relative movement therebetween. The carriage may be displaced along its rails by means of a drive screw 33 which passes through a threaded bushing 34 constructed on base 30 and affixed to carriage 32 through a socket joint which permits rotation of the drive screw with respect to the carriage. The drive screw is represented as terminating in a handle 35 which may be rotated to advance or retract the carriage along stationary member 30. This is for convenience in the drawing; actually, it is desirable to assure uniform linear motion of carriage 32 from the full line position of FIGURE 4 to its alternate position shown in dotted-construction line in the same figure. Generally, this would be accomplished in any apparatus employed for commercial production by a power drive which may be mechanical, hydraulic or of the vacuum type. All are well understood in the art and since they of themselves constitute no particular part of the invention in question, the convenience of a hand operated screw has been resorted to for purposes of illustration.

Carriage 32 is of hollow construction and its upper surface or bed 36 is perforated so that a vacuum line 37 which communicates with the interior of carriage 32 may provide a convenient means for holding work upon bed 36 especially where the work is in the form of a sheet. A rail 38 is provided at one side of carriage 32 as a device to facilitate positioning work on bed 36 in known relation relative thereto. It is desirable to have rail 38 supported for sliding movement so that it may be brought close to carriage 32 (as shown) in order to position core 10 thereon and then be moved away from the carriage so that it does not engage the end of the core during the pattern-transferring operation. Another rail 39 is similarly positioned at the back of carriage 32. It is also appropriate to have a pair of projections (not shown) extend from rail 39 in the direction of screw 33 to be received by notches 11 of core 10 of the tuning strip in order to establish a know angular orientation of the core when it is initially positioned on the carriage.

Figures 4, 5:
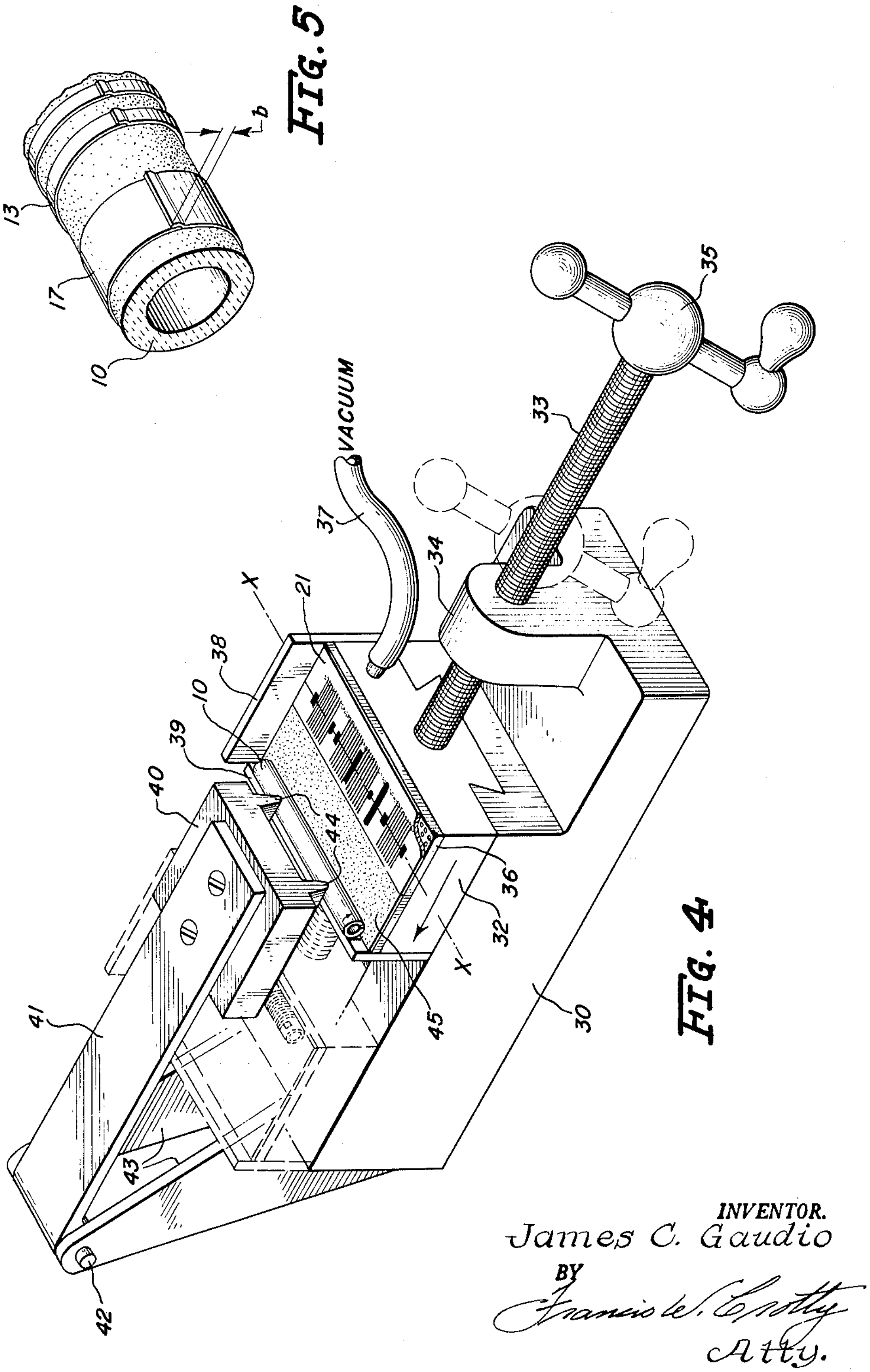
FIGURE 4 represents one form of transfer mechanism through which the subject invention may be practiced.

A pressure plate 40 is pivotally suspended over the path traversed by carriage 32 as it moves from an initial position represented in full-line construction in FIGURE 4 to its alternate position shown in dotted-construction lines in the same figure. This plate is carried by an arm 41 suspended through a pivot pin 42 from a pair of support arms 43 which extend vertically upwardly from base 30 of the coating fixture. A pair of rails 44 extend downwardly from the lower surface of pressure plate 40 and extend longitudinally of the lower surface and parallel with the axis of movement of carriage 32. The rails are V-shaped in cross section to effect essentially point contacts with the cylindrical core that is placed on the bed of carriage 32 as shown in FIGURE 4. The location of rails 44 is chosen to contact portions of core 10 which are not to receive any portion of the pattern carried by transfer sheet 21 for the simple reason that the wiping action of these rails on the core tends to strip the contact area of the adhesive required to transfer and affix the component patterns to the core.

It is expedient to incorporate into the fixture of FIGURE 4 a coating stage charged with the adhesive to be applied to core 10 and this is readily accomplished by having the axial length of carriage 32 sufficient to accommodate a strip 45 of tape which carries a suitable coating of the adhesive material. Where the coating stage is integrated with this fixture, tape 45 is positioned intermediate rail 39 and strip 21 which bears the developed circuit-component patterns. The rails 38 and 39 plus shaping of strip 21 and tape 45 permit both the strip and tape to be disposed with their longitudinal axes perpendicular to the direction of movement of carriage 32. For convenience, the axis of strip 21 is designated *x, x*. Additionally, the leading edge of strip 21, that is to say, the edge which is closer to rail 39 is as close as conveniently practicable to the leading portion of the developed patterns printed theron in order to minimize the gap between the trailing end of tape strip 45 and the start of these patterns. After the fixture of FIGURE 4 has been loaded to include tape strip 45 and pattern strip 21, manipulation of handle 35 permits this single fixture to accomplish coating of the core which is represented in block 23 of the flow chart as well as transferring of the circuit-component patterns to the core, the step represented in box 25 of the flow chart. The accomplishment of these two steps is as follows.

Tape strip 45 and pattern strip 21 are retained in position on bed 36 by the holding effect of the vacuum created through the connection to a vacuum system (not shown) by means of line 37. Clockwise rotation of handle 35 advances carriage 32 toward the rear of the fixture and the pressure exerted by pressure plate 40 forces core 10 into intimate contact with coated tape 45. As a consequence, longitudinal displacement of the carriage causes the core to roll over tape strip 45 to the end that the core picks up or is coated by the adhesive borne by tape strip 45. When the carriage has advanced sufficiently to cause core 10 to make a complete pass across tape strip 45, the core will have been presented in contact with pattern strip 21 in alignment with the circuit-component patterns carried thereby. It is apparent that control of the dimensions of strip 21 and the positioning of the core on the fixture by means of rails 38 and 39 permit appropriate alignment of the core with the several printed patterns of strip 21. It will also be apparent that suitable selection of the width dimension of tape 45, that is, the dimension measured along the axis of movement of carriage 32, assures that establishing a desired angular orientation of core 10 in its initial position on bed 36 by means of indexing recesses 11, results in presenting the core in a proper angular aspect relative to tape 21 after the core has passed over tape strip 45 and acquired the necessary coating of adhesive.

Continued relative movement of carriage 32 and core 10, while pressure plate 40 exerts a pressure upon these elements, maintains an intimate contact therebetween to cause core 10 to roll over pattern strip 21 and transfer the patterns which it carries to the core. More particularly, continued clockwise rotation of handle 35 advances carriage 32 toward the position shown in broken-line construction in FIGURE 4. In this final movement of the carriage, pressure plate 40 bearing upon core 10 causes the core to roll over the patterns of strip 21 and since the adhesive coating of the core has a greater adhesion for the printed patterns than does transfer sheet 21, the patterns are picked off the transfer sheet and applied to the core, being wrapped therearound per force of the rotation of the core. Having properly aligned core 10 against rail 39 initially, its direction of motion remains parallel to this rail and normal to the axis of displacement of carriage 32 which is desirable in completing the coil turns represented by the canted lines of the developed patterns into a continuous series of convolutions of a helix.

Since the adhesive applied to core 10 and tape strip 45 is of the pressure-sensitive type, a uniform pressure exerted by plate 40 against the core as it traverses pattern strip 21 effects the desired transfer. In order to insure that the patterns have an intimate and smooth contact with the core, without ripples, undulations and the like, it is desirable that bed 36 of carriage 32 upon which strips 21 and 45 rest be formed of a resilient material such as rubber to yield in the presence of any slight deformations that may exist in the coil pattern or in the cylindrical core member.

As stated above, in printing the developed patterns on strip 21 the dimension *a* corresponding to a developed coil turn is larger by an amount *b* than the circumferential dimension of core member 10. As a consequence, when carriage 32 has assumed its final position, represented in broken-construction line in FIGURE 4, the pattern transfer has been completed and there is an overlap by an amount *b* of each conductor turn which has been formed on the core. This is clearly shown in the enlarged fragmentary view of FIGURE 5. Since the trailing ends of the developed core turns have previously been coated with an adhesive, as described in the discussion of box 24 of the flow chart, the helices or multiturn coils 12–15 are of a continuous character which is essential in order to achieve electrical continuity between contact patches 16, 16 affixed to the first and last turns of each such coil.

Having transferred the coil patterns to the tuning strip core, the assembly is fired or subjected to a heat treatment to remove all organic material therefrom and also to melt the glass frit of the printing composition to integrate the circuit patterns with core 10. This has been accomplished by heating the assembly in an oven at a temperature of 1500° F. for approximately one hour. The heat treatment burns out all of the organic materials present in the adhesive which has been applied from tape strip 45 to core 10 and from the plastic binder of the printing composition. The heat treatment has a further advantage in that if the silver flakes included in the printing material have become oxidized the heating reduces the silver oxide to metallic silver and improves the conductive properties of contact patches 16 and coils 12–15. At the same time, the heat treatment secures the bonds of the overlapping portions of the coil turns and, by burning out the organic materials of the adhesive, establishes the desired electrical connections between the overlapping portions of the coil turns. The sintering or fusing of the glass frit to the surface of the coil form bonds the metallic flakes of the coil patterns rigidly to the surface of the core.

Box 27 of the flow chart shows the last step of the process to be building up of the patterns transferred to core 10 by barrel plating. This is a conventional technique for adding metal to the printed patterns to increase their thickness and provide control of conductivity and inductance. This step is of course optional but has the advantage, particularly in respect of contact areas 16, of making them more suitable for repeated engagement and disengagement with the stationary contacts of the tuner in its normal use.

Figure 6:
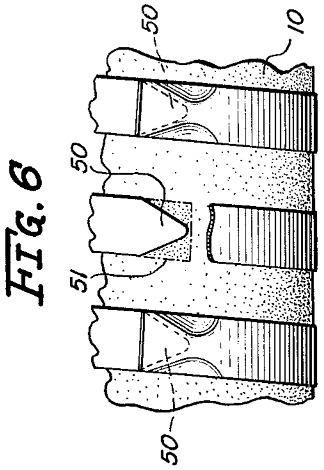

Shaping of those portions of the developed patterns which correspond to the leading and trailing edges of the conductor turns may be resorted to in place of the application of an adhesive to the trailing ends of the pattern as described in connection with box 24 of the flow chart. For example, the leading portion of each coil turn may have a generally V-shaped section 50 as shown in FIGURE 6. If the trailing end of the coil turn is shaped to overlap the V-section, it will contact a portion of core 10 and be caused to adhere to the core because of the coating of adhesive which the core carries. The broken-construction lines 51 of FIGURE 6 set aside the portion of the core which may be engaged by the trailing end of the coil turn as it overlaps the leading end and affixes itself to the core as required. While the shaping in FIGURE 6 shows a forwardly extending taper of the coil turn, the V-shape may be cut out of the leading end of the coil turn extending in the opposite direction, namely, a direction opposite to that in which taper 50 extends.

If desired, the locating recesses 11 of core 10 may be omitted and the pattern printing process be practiced as described but without any particular concern over the angular relation of the pattern on the core. In such a case, mounting clips are added after the core has received the required patterns and the orientation of the strip within the turret is provided by the mounting clips.

Figure 7:
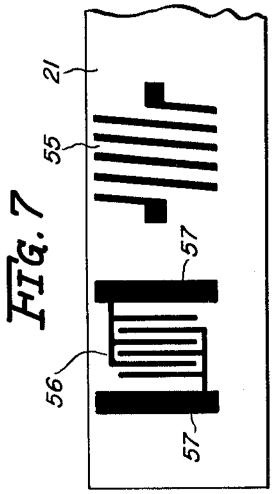
FIGURES 5 through 7 pertain to details and other forms of printed circuit elements of interest in detailed discussion of the invention.

Obviously, the described method may be employed to print resistors and capacitors on the coil form where these are desired. In FIGURE 7, transfer strip 21 has a pattern 55 which is the same as the pattern of a coil as to configuration but if the coating has an ingredient of controlled conductivity, this will serve to print a resistor of known value on the core. The other pattern 56 represented in FIGURE 7 is that of a capacitor which has three pairs of interleaved electrodes. Corresponding members of each such pair are connected together and to contact terminal portions 57.

Tuning strips have been constructed in accordance with the aforedescribed process and have been found to be entirely satisfactory both with respect to the quality of the circuit components and the feasibility of fabrication. The process lends itself to automation, that is to say, to be practiced by a machine exercising controlled steps in accordance with the foregoing description. Such a machine application of the process permits tuning strips of the type in question to be constructed quickly and economically.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. In the printing of an electrical component, having a desired pattern and predetermined electrical properties, upon a core member which in cross section has at least a portion that is a continuous curve, the method which comprises the following steps: printing upon a first surface an at least substantially solidified developed pattern of said component formed of a composition of material including an ingredient exhibiting properties corresponding to said predetermined electrical properties; applying a coating of adhesive material, which has a greater adhesion for said composition than does said first surface, to at least one of the surfaces represented by said pattern and by the external periphery of said curved portion of said core member; placing said curved portion of said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member.

2. In the printing of an electrical component, having a desired pattern and predetermined electrical properties, upon a core member which in cross section has at least a portion that is a continuous curve, the method which comprises the following steps; printing upon a sheet of release paper an at least substantially solidified developed pattern of said component formed of a composition of material including an ingredient exhibiting properties corresponding to said predetermined electrical properties; applying a coating of adhesive material, which has a greater adhesion for said composition than does said release paper, to at least one of the surfaces represented by said pattern and by the external periphery of said curved portion of said core member; placing said curved portion of said core member in contact with said release paper and in alignment with said developed pattern; and effecting relative movement of said core member and said release paper while exerting pressure thereon to establish and maintain intimate contact therebetween to cause said core member to roll over said pattern and transfer said pattern thereto progressively as said pattern contacts said core member.

3. In the printing of an electrical component, having a desired pattern and predetermined electrical properties, upon a core member which in cross section has at least a portion that is a continuous curve, the method which comprises the following steps: printing upon a first surface an at least substantially solidified developed pattern of said component formed of a composition of material including an ingredient exhibiting properties corresponding to said predetermined electrical properties; applying a coating of adhesive material, which has a greater adhesion for said composition than does said first surface, to at least the external periphery of said curved portion of said core member; placing said curved portion of said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member.

4. In the printing of an electrical component, having a desired pattern and predetermined electrical properties, upon a core member which in cross section has at least a portion that is a continuous curve, the method which comprises the following steps: printing upon a first surface an at least substantially solidified developed pattern of said component formed of a composition of material including a first ingredient exhibiting properties corresponding to said predetermined electrical properties and further including a second ingredient which, when subjected to heat, may fuse to said core member; applying a coating of adhesive material, which has a greater adhesion for said composition than does said first surface, to at least one of the surfaces represented by said pattern and by the external periphery of said curved portion of said core member; placing said curved portion of said core member in contact with said first surface and in alignment with said developed pattern; effecting relative movement of said core member and said first surface while exerting pressure thereon to establish and maintain intimate contact therebetween to cause said core member to roll over said pattern and transfer said pattern thereto progressively as said pattern contacts said core member; and heating said core member with said transferred pattern to the fusion temperature of said second ingredient to fix said pattern to said core member.

5. In the printing of an electrical component, having a desired pattern and predetermined electrical properties, upon a ceramic core member which in cross section has at least a portion that is a continuous curve, the method which comprises the following steps: printing upon a first surface an at least substantially solidified developed pattern of said component formed of a composition material including an ingredient exhibiting properties corresponding to said predetermined electrical properties and further including a glass frit which, when subjected to heat, may fuse to said core member; applying a coating of adhesive material, which has a greater adhesion for said composition than does said first surface, to at least one of the surfaces represented by said pattern and by the external periphery of said curved portion of said core member; placing said curved portion of said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member; and heating said core member with said transferred pattern to fuse said frit and fix said pattern to said core member.

6. In the printing of an electrical component, having a desired pattern and predetermined electrical properties, upon a core member which in cross section has at least a portion that is a continuous curve, the method which comprises the following steps: printing a developed pattern of said component upon a first surface by depositing a composition of material including a first ingredient exhibiting properties corresponding to said predetermined electrical properties, a second ingredient which when heated may fuse to said core member, a binder, and a solvent for said binder; heating said first surface to drive off said solvent and fix said pattern thereto; applying a coating of adhesive material, which has a greater adhesion for said composition than does said first surface, to at least one of the surfaces represented by said pattern and by the external periphery of said curved portion of said core member; placing said curved portion of said core member in contact with said first surface and in alignment with said developed pattern; effecting relative movement of said core member and said first surface while exerting pressure thereon to establish and maintain intimate contact therebetween to cause said core member to roll over said pattern and transfer said pattern thereto progressively as said pattern contacts said core member; and heating said core member with said transferred pattern to the fusion temperature of said second ingredient to fix said pattern to said core member.

7. In the printing of an electrical component, having a desired pattern and predetermined electrical properties, upon a core member which is generally cylindrical in cross section, the method which comprises the following steps: printing upon a first surface an at least substantially solidified developed pattern of said component formed of a composition of material including an ingredient exhibiting properties corresponding to said predetermined electrical properties; positioning said surface in side-by-side relation to a coating station charged with adhesive material which has a greater adhesion for said composition than does said first surface; positioning said core member with its longitudinal axis parallel to a border of said coating station and of said pattern; moving said core member through said coating station to coat the external surface thereof with said adhesive material; and effectively moving said coated core member over said first surface while exerting pressure thereon to establish and maintain intimate contact therebetween to cause said core member to roll over said pattern and transfer said pattern thereto progressively as said pattern contacts said core member.

8. In the printing of an electrical component, having a desired pattern and predetermined electrical properties, upon a core member which is generally cylindrical in cross section, the method which comprises the following steps: printing upon a first surface an at least substantially solidified developed pattern of said component formed of a composition of material including an ingredient exhibiting properties corresponding to said predetermined electrical properties; positioning said surface in side-by-side relation to a second surface coated with an adhesive material which has a greater adhesion for said composition than does said first surface; positioning said core member with its longitudinal axis parallel to a border of said second surface and of said pattern; rolling said core member across said second surface to coat the external surface thereof with said adhesive; and effectively moving said coated core member over said first surface while exerting pressure thereon to establish and maintain intimate contact therebetween to cause said core member to roll cover a said pattern and transfer said pattern thereto progressively as said pattern contacts said core member.

9. In the printing of an electrical component having a series of conductor turns on a generally cylindrical core member, the method which comprises the following steps: printing on a first surface on at least substantially solidified developed pattern of said component formed of a composition of conductive material and in which the pattern length corresponding to one of said conductor turns exceeds the circumferential dimension of said core member; applying a coating of adhesive material, which has a greater adhesion for said composition than does said first surface, to at least one of the surfaces represented by said pattern and by the external periphery of said core member; placing said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member.

10. In the printing of an electrical component having a series of conductor turns on a generally cylindrical core member, the method which comprises the following steps: printing on a first surface an at least substantially solidified developed pattern of said component formed of a composition of conductive material and in which the pattern length corresponding to each of said conductor turns exceeds the circumferential dimension of said core member; applying a coating of adhesive to the trailing end of each portion of said pattern corresponding to one of said conductor turns; applying a coating of adhesive material, which has a greater adhesion for said composition than does said first surface, to the external circumference of said core member; placing said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member.

11. In the printing of an electrical component having a series of conductor turns on a generally cylindrical core member, the method which comprises the following steps: printing on a first surface an at least substantially solidified developed pattern of said component formed of a compositton of conductive material and in which the pattern length corresponding to each of said conductor turns exceeds the circumferential dimension of said core member, in which the leading end of each such developed conductor turn has a generally V-shaped section and in which the trailing end of each such developed conductor turn is shaped to overlap and extend beyond the sides of said V-shaped section when said pattern is transferred to said core member; applying a coating of adhesive material, which has a greater adhesion for said composition than does said first surface, to the external circumference of said core member; placing said core member in contact with said first surface and in alignment with said developed pattern; and effecting relative movement of said core member and said first surface while exerting pressure thereon to establish and maintain intimate contact therebetween to cause said core member to roll over said pattern and transfer said pattern thereto progressively as said pattern contacts said core member.

12. In the printing of an electrical component having a series of conductor turns on a generally cylindrical core member, the method which comprises the following steps: printing on a first surface and with a composition of conductive material a developed pattern of said component in which the pattern length corresponding to each of said conductor turns exceeds the circumferential dimension of said core member, in which the leading end of each such developed conductor turn is formed to have a generally V-shaped section and in which the trailing end of each such developed conductor turn is shaped to overlap and extend beyond the sides of said V-shaped section when said pattern is transferred to said core member; aligning said core member with said developed pattern and transferring and affixing said developed pattern onto said core member with said trailing end overlapping said leading end.

References Cited by the Examiner

UNITED STATES PATENTS

| | | | |
|---|---|---|---|
| 1,298,992 | 4/1919 | Merkle et al. | 24—67.1 |
| 1,735,894 | 11/1929 | Coombs | 24—67.1 |
| 2,067,447 | 1/1937 | Hommel | 101—39 |
| 2,303,480 | 12/1942 | Lepic | 101—39 |
| 2,419,918 | 4/1947 | Scheitz | 156—89 |
| 2,438,514 | 3/1948 | Miller | 156—89 |
| 2,566,735 | 9/1951 | Lepic | 156—89 |
| 2,746,893 | 5/1956 | Matthes | 154—99 XR |
| 2,776,235 | 1/1957 | Peck. | |
| 2,831,136 | 4/1958 | Hanlet | 336—200 |
| 3,005,966 | 10/1961 | Strom | 336—200 |
| 3,011,247 | 12/1961 | Hanlet | 336—200 |

FOREIGN PATENTS

| | | |
|---|---|---|
| 126,869 | 5/1919 | Great Britain. |

EARL M. BERGERT, *Primary Examiner.*

ALEXANDER WYMAN, *Examiner.*